(12) United States Patent  
Partridge et al.

(10) Patent No.: US 7,759,791 B2
(45) Date of Patent: Jul. 20, 2010

(54) HIGH DENSITY IC MODULE (75) Inventors: Julian Partridge, Austin, TX (US); Leland Szewerenko, Austin, TX (US); James Douglas Wehrly, Jr., Austin, TX (US)

(73) Assignee: Entorian Technologies LP, Austin, TX (US)

( * ) Notice: Subject to any disclaimer, the term of this patent is extended or adjusted under 35 U.S.C. 154(b) by 275 days.

(21) Appl. No.: 11/738,330

(22) Filed: Apr. 20, 2007

(65) Prior Publication Data

US 2008/0093734 A1 Apr. 24, 2008

Related U.S. Application Data (60) Provisional application No. 60/862,431, filed on Oct. 20, 2006.

(51) Int. Cl.
*H01L 23/34* (2006.01)
(52) U.S. Cl. .................. 257/723; 257/698; 257/777; 257/778; 257/E23.169; 257/E23.174; 438/107; 438/110
(58) Field of Classification Search .......... 257/723, 257/698, 777, 778, E23.169, E23.174; 438/107, 438/110
See application file for complete search history.

(56) References Cited

U.S. PATENT DOCUMENTS

| 4,862,322 | A | 8/1989 | Bickford et al. | |
| 6,838,768 | B2 | 1/2005 | Corisis et al. | |
| 2002/0056925 | A1 | 5/2002 | Kang et al. | |
| 2002/0171130 | A1* | 11/2002 | Takahashi et al. | 257/673 |
| 2003/0197271 | A1* | 10/2003 | Corisis et al. | 257/738 |
| 2004/0036164 | A1* | 2/2004 | Koike et al. | 257/723 |
| 2005/0090050 | A1 | 4/2005 | Shim et al. | |
| 2005/0236684 | A1* | 10/2005 | Chen et al. | 257/433 |

OTHER PUBLICATIONS

PCT/US07/81964 International Search Report and Written Opinion, PCT, May 7, 2008.

* cited by examiner

*Primary Examiner*—Tu-Tu V Ho
(74) *Attorney, Agent, or Firm*—Civins Denko Coburn & Lauff LLP (57) ABSTRACT

A system and method for assembling dual-die integrated circuit packages using thermocompression bonding or thermosonic bonding to bond a second die to a substrate opposite a first die bonded to the substrate. The second die is bonded using heat conducted through the first die to the substrate, and optionally through an underfill material. The first and second die are connected such that bumps are connected to common bonding pads on the substrate. Bumps on one of the die extend through openings in the substrate to connect to the common bonding pads. The bonding pads are within the perimeter of the first die.

2 Claims, 6 Drawing Sheets

HIGH DENSITY IC MODULE

CROSS-REFERENCE TO RELATED APPLICATIONS

This application claims priority to provisional application No. 60/862,431 filed Oct. 20, 2006, pending, which is hereby incorporated by reference,

TECHNICAL FIELD

The present invention generally relates to integrated circuits and, in particular, to bonding of multiple die on substrates for use in stacked integrated circuit packages.

BACKGROUND OF THE INVENTION

A variety of techniques are used to stack integrated circuits into a module. Some require that the circuits be encapsulated in special packages, while others use circuits in conventional packages. Both leaded and BGA type packaged integrated circuits (ICs) have been stacked. Although BGA packaging has become widely adopted, leaded packages are still employed in large volumes in low cost applications such as, for example, flash memory, which, when packaged, is typically found in thin small outline packages otherwise known as TSOPs.

Other technologies have been devised to stack bare die or flip-chip configured integrated circuits. In a typical example, flex circuitry upon which such integrated circuits have been affixed has been employed to supplant the role of encapsulating packaging. In some strategies, flex circuitry bearing bare or flip-chip die is folded over itself to yield a multi-level module in which the constituent die are disposed vertically one above the other with module contacts being provided along one or more surfaces of the flex circuitry. In other strategies, such as purportedly disclosed in U.S. Pat. No. 6,388,333 to Taniguchi, et al., a substrate bears an integrated circuit die that is encapsulated by a seal material having a height less than protruding electrodes connected to pads on the redistribution substrate which are connected to the die. Other previous systems have purportedly disposed flip-chip devices with active face down on substrates that are connected one to another through conductive members as described in U.S. Pat. No, 6,781,241 to Nishimura et al.

Thermocompression bonding and thermosonic bonding are processes used for single-side bonding, for example, in the manufacture of LCD displays. Previous thermocompression or thermosonic bonding systems are typically used to affix die only to one side of a substrate, such as in certain flip chip configurations. Accordingly, what is needed is a system and method for bonding die on opposite sides of a substrate using thermocompression or thermosonic bonding.

Most previous systems that employ unpackaged die have provided complex structures with attendant scalability and construction technique complexities. Consequently, what is needed is a system and method for stacks and stacking die that is readily adaptable to scalability, while using well understood materials with facility for known good die management.

SUMMARY OF THE INVENTION

The present invention provides a system and method for stacked dual-die circuit modules and stackable dual-die assemblies that may be used to create a stacked circuit module or package. Multiple integrated circuit (IC) dice are mounted on opposite sides or surfaces of a redistribution substrate. Thermocompression or thermosonic bonding may be used to mount one or both die. Although thermocompression or thermosonic bonding (TC/TS) have been employed in, for example, flex-ship attachment to flex circuitry, the present invention provides novel structures and methods for multi-die modules.

In some embodiments, bonding pads are disposed between the substrate and the second die within the perimeter of the first mounted die. In other embodiments, a single set of pads may be bonded to bumps on two separate dice through openings in the substrate. Alternatively, the first and second die are bonded to the substrate using complimentary aligned bonding pads connected by conductive vias through the substrate. Pad-to-pad or dual bump-to-pad mounting improves signal integrity by eliminating the need for conventional forked conductive traces.

Still, in other embodiments, a first mounted die may be used to heat the substrate to facilitate bonding of the second die. Compression forces and/or ultrasonic vibrations with or without heating the second die may then be applied in combination with the heat from the first die to bond the second die. A thermally conductive underfill material may be used to improve heat transfer to the substrate.

TC/TS bonding of DRAM die according to various embodiments of the present invention provides substantial improvements in signal integrity and cost of manufacturing compare to conventional wire bonding. Additionally, the overall profile of the mounted parts is lower and it may not be necessary to mold over the mounted part, since there are no wires to protect. TC/TS bonding can also provide lower temperature bonding and can be used at tighter pitches than conventional assembly processes.

DETAILED DESCRIPTION

In accordance with various aspects of the present invention, a dual-die IC configuration is provided for use in IC packages. The present invention may be used to form any number of stacked or non-stacked IC packages using any number of bonding techniques. That being said, the present invention is described herein in the exemplary context of thermocompression bonding and/or thermosonic bonding of die to substrates for use in stacked flash and DRAM IC packages.

The term "substrate" as described herein may include, but is not necessarily limited to, a redistribution substrate useful in forming stacked integrated circuit packages. The substrate may be of any shape or size and in general, may be constructed from a wide variety of materials including, but not necessarily limited to, flex (generally polyimide-based), FR4, BT resin, alumina, silicon, glass epoxy, polyimide, polycarbonate, and the like. One possible substrate for die mounting and interconnect is a 1 metal layer flex circuit.

Thermocompression (TC) and thermosonic (TS) bonding have previously been limited to use on a single side of the substrate, for example, in the manufacture of LCD displays. In accordance with various embodiments, thermocompression or thermosonic bonding techniques are used to bond a second die to a second side or surface of the substrate. Use of TC/TS bonding with DRAM is advantageous for signal integrity while use with flash is advantageous for reducing the height of the bonded die above the substrate.

In the TC/TS bonding processes, preformed bumps, for example gold bumps, are bonded to corresponding conductive connectivity sites or bonding pads covered, for example, with gold or tin, by heat in combination with compressive forces and/or vibrational energy. For example, thermocompression bonding of gold bumps to gold pads employs high compression forces on a surface with a high temperature; around 300° C. to 425° C. Compression forces may, preferably, be on the order of 1 N for an 80 μm bump. The use of gold bumps with tin pads allows for lower temperature and pressure bonding. In the latter case, the heat used is sufficient to melt the tin and cause the formation of a gold-tin intermetallic alloy which forms the joint. In either approach, the die and substrate are aligned to ensure good co-planarity and good bonding to avoid open circuits or incomplete bonds.

Thermosonic bonding employs temperatures of around 100° C. to 240° C. with ultrasonic energy (e.g., ultrasonic excitation or vibration) and relatively low compressive forces. Thermosonic compressive forces may be on the order of approximately 0.4-1.0 N/bump. Thermosonic bonding is particularly advantageous with gold to gold joints, which otherwise require much higher temperatures and pressures. Ultrasonic bonding may also be employed by providing vibrational energy at ambient temperature without the need for high compressive forces. Ultrasonic energy is transferred to the bonding area using a pick-up tool through the back surface of the die. The ultrasonic energy softens the bonding material, and helps to break through the surface contamination of the bumps and pads, thereby promoting the welding of the bump and pad metals. It also shortens the processing time compared to thermocompression bonding.

The preformed bumps used for bonding may be configured on the die, or alternatively on the substrate with corresponding bonding pads on the other of the die or substrate. The bumps may be applied to the die, for example, before or after dicing, by electroplating, electroless plating, evaporation, sputtering, or by use of a conventional wire bonder programmed for creating bumps. The bumps connect to corresponding connection sites on the bonding pad configuration. The bumps may comprise any number of metals or alloys including Au, Cu, Al, Ni or any other suitable metallic or nonmetallic conductor. Non-conductive bumps may also be used in certain assembly configurations, for example for use as spacers. The bump material may be selected and the bumps shaped and sized for a desired bonding method.

A centrally positioned bonding pad row configuration allows the dice to be mounted face-to-face, on opposite sides of a substrate, with the same-function bonding pads immediately opposite each other. Use of bonding pads instead of wire bonding reduces the number and length of connections, improving signal integrity. This arrangement provides for improved signal integrity in high frequency DRAM applications such as, for example, DDR2-800 MHz and DDR3 applications.

In various alternative embodiments, one or more of the die may be bonded by other than TC/TS bonding. For example, adhesive bonding (isotropic, anisotropic, conductive, non-conductive), ultrasonic bonding, tape bonding and the like are contemplated within the scope of various embodiment described herein. Similarly, combinations of bonding techniques described herein may be used in accordance with various alternative embodiments.

Underfill may be applied along or from any number of sides of a die. Underfill material may include any suitable, epoxy, resin, acrylic, polyimide, or polymer and may be cured by heating or other process. The underfill material is preferably selected such that capillary forces between the IC and the substrate draw the underfill material inward from the point of application. In one embodiment, curing of underfill applied to a first die may overlap with heating of the first die in preparation for bonding of a second die. In some cases the underfill material is deposited on the substrate and conforms to the die-to-substrate gap during the die bonding operation. Underfill cure is completed after the die is attached.

Any number of other manufacturing processes may be performed at various stages of preparation of a die, substrate, or stacked package within the scope of embodiments described herein. While not described herein in detail, such other processes may include, for example, flux application, solder paste printing, die pick, die alignment, die placement, reflow soldering, cleaning of flux or other residues, testing and the like. There are benefits in constructing the substrate support fixture from a material of low thermal conductivity to allow the metallurgical bonding interface to reach the required temperature without the joints being cooled by conduction to the support fixture. Suitable materials include glass, ceramic, or high modulus, low thermal conductivity polymer-based materials.

Figure 1:
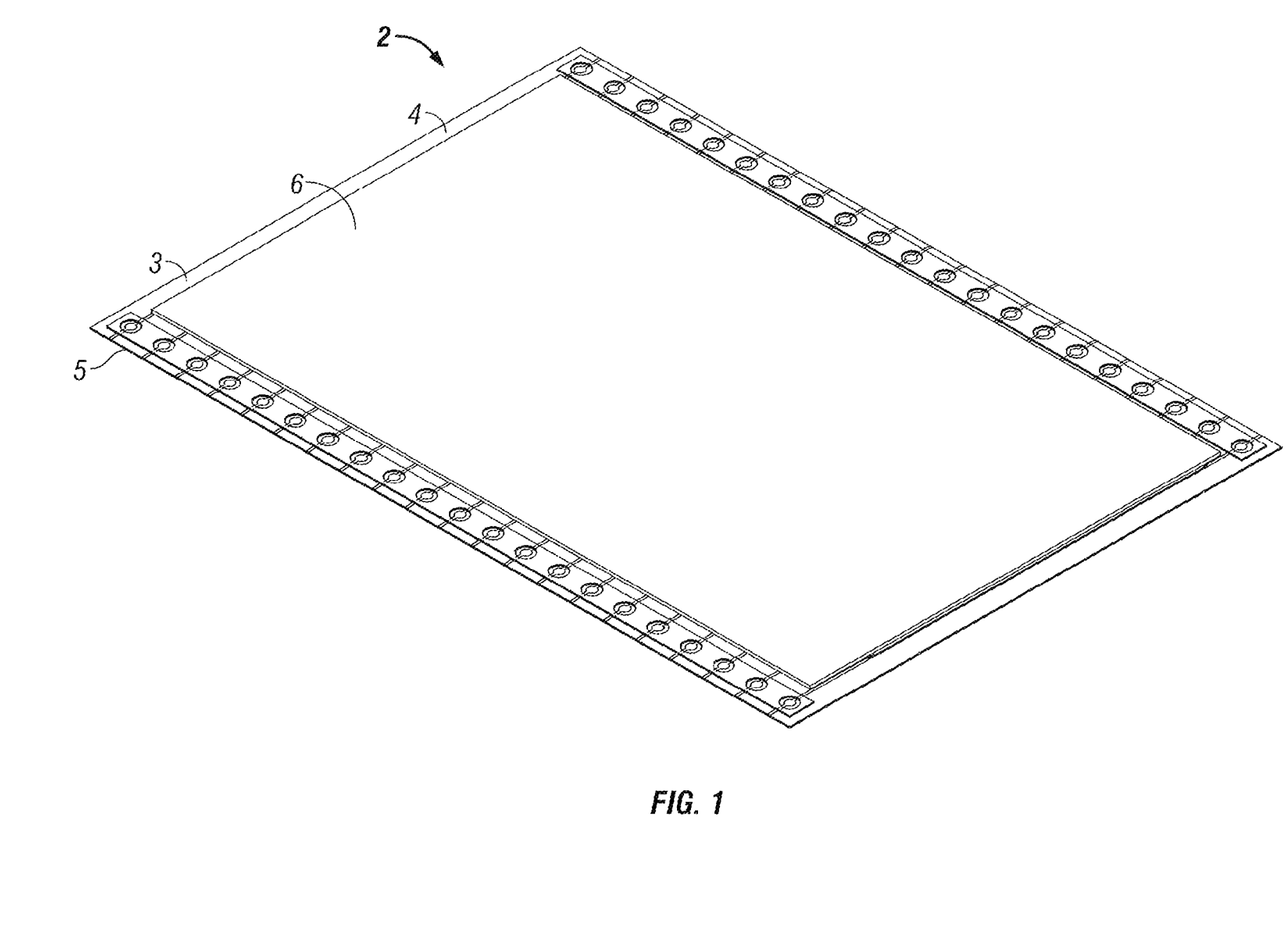
FIG. 1 is a perspective depiction of an exemplary assembled dual-die package as may be employed in embodiments.

Turning now to the drawings, FIG. 1 is a perspective depiction of an exemplary assembled dual-die package 2. Package 2 includes a redistribution substrate 4 with, a first die 6 mounted to a first surface 3 of substrate 4 and a second die (not shown in this figure) mounted to a second surface 5 of substrate 4. First die 6 may be mounted or bonded to substrate 4 by any suitable method now known or later developed, such as thermocompression bonding, thermosonic bonding, ultrasonic bonding and/or adhesive bonding. The second die is mounted to second surface 5 of substrate 4 by thermocompression bonding and/or thermosonic bonding. Those of skill will understand that both first die 6 and second die 8 maybe bonded to substrate 4 by thermocompression bonding and/or thermosonic bonding in alternative embodiments. Package 2 may by stacked with other packages to form a stacked IC package.

Figure 2:
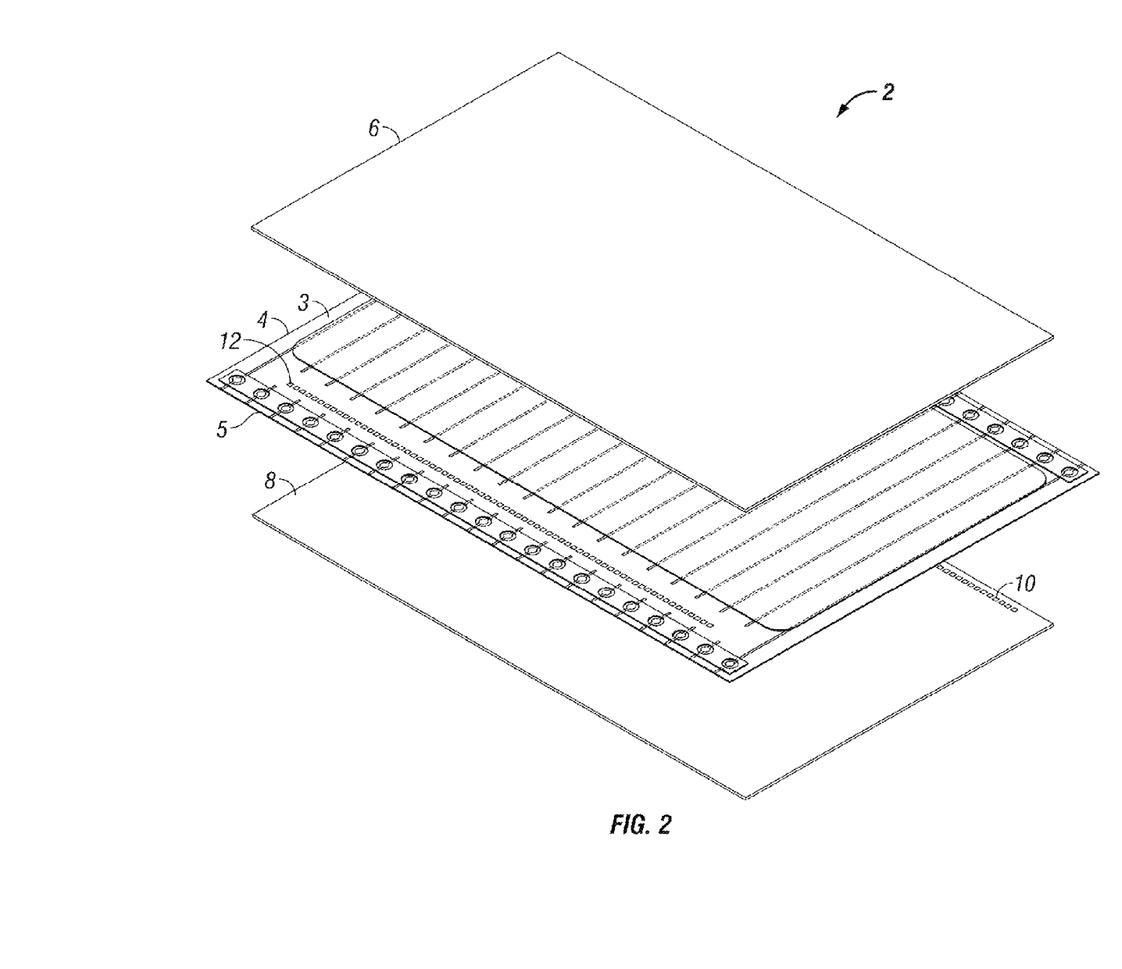
FIG. 2 is an exploded perspective depiction of an exemplary dual-die package as may be employed in embodiments.

FIG. 2 is an exploded perspective depiction of an exemplary dual-die package 2, including, substrate 4, first die 6 and a second die 8. First die 6 and second die 8 each carry a series of bonding bumps 10, visible in FIG. 2 along the far upper lateral perimeter of second die 8. A series of corresponding bonding pads 12 are disposed on first surface 3 and second surface 5 of substrate 4, visible in FIG. 2 along the near upper lateral perimeter of substrate 4. During assembly of package 2, bumps 10 on first die 6 are aligned with pads 12 on first surface 3 of substrate 4. Bumps 10 and pads 12 are then bonded using a combination of thermal energy, pressure, ultrasonic vibration, or adhesive.

In order to use thermocompression or thermosonic bonding to bond either of first die 6 or second die 8 to substrate 4, a certain degree of heat or thermal energy is required at the interface between corresponding humps 10 and pads 12. Previously, this thermal energy was provided in part in single side bonding by background heating of the substrate to a suitable temperature. Heat may also be applied to the die to be bonded. In the single sided process, heating the substrate also served to prevent it from robbing heat from the die and joints when initial contact was made.

In various present embodiments, at least part of the thermal energy required during bonding of second die 8 to substrate 4 is provided by heating first die 6 previously bonded to substrate 4. In other embodiments, substantially all of the thermal energy required to bond second die 8 to substrate 4 may be provided through first die 6. For bonding of the second die in double-sided bonding, it is preferable that the substrate and first bonded die not act as heat sinks to rob heat from the preheated second die. For this purpose heat is applied to the exposed side of the first die through the supporting stage of the bonding machine. By elevating this temperature above that used for single-sided bonding, the bonding process is expedited and heat robbing is minimized. It is also advantageous for the bulk of the supporting stage to be composed of a material with low thermal conductivity. Such as a porous ceramic as opposed to solid metal. In this way, the supporting stage does not serve as a heat sink during the bonding process.

Thermal conductivity between first die 6 and substrate 4 may be enhanced by use of a thermally conductive underfill material. Heating of first die 6 may further serve to at least partially cure the underfill material. Upon sufficient heating of substrate 4, compressive forces or vibrational energy is applied to bond bumps 10 and bonding pads 12. The compressive forces or vibrational energy may be applied to any of substrate 4, first die 6 or second die 8 during any bonding step described herein.

Figure 3:
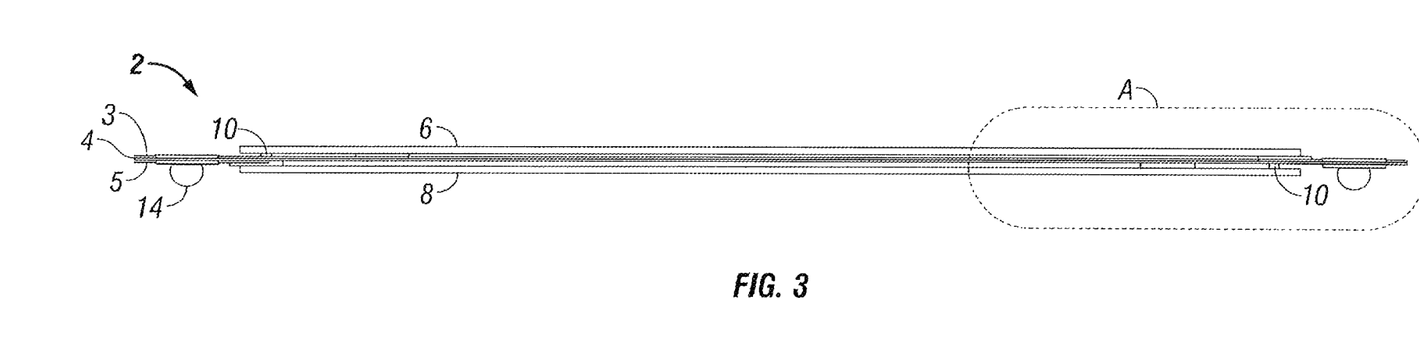
FIG. 3 is a front depiction of an exemplary dual-die package as may be employed in embodiments.

FIG. 3 is a front elevation depiction of an exemplary assembled dual-die package 2 having solder balls 14 formed along each side for connection to other components, for example for stacking with other packages 2. in a stacked configuration. In the depicted embodiment, bumps 10 are visible near the edge of first surface 3, within the perimeter of first die 6 and near the edge of second surface 5, within the perimeter of second die 8. In various embodiments it is advantageous to have corresponding bumps 10 not only within the perimeter of the respective die, but to have. corresponding bumps 10 within the perimeter of the other die.

Any number of spacer elements (not shown) may, but need not, be used in any number of locations between substrate 4 and die 6 and 8 to suitably align dice 6 and 8 for bonding with substrate 4. Spacer elements may be a polymeric bump such as soldermask or a metallic bump such as a solderball. There does not need to be a corresponding pad on the die surface. Such features are useful when the bond pads 12 are not well-distributed across the face of the die (this is often the case for DRAM and flash die that are designed for wire-bonded packages). Alternatively a bump-like feature may be added to the die surface during, or after, the wafer- or die-bumping operation.

Figure 4:
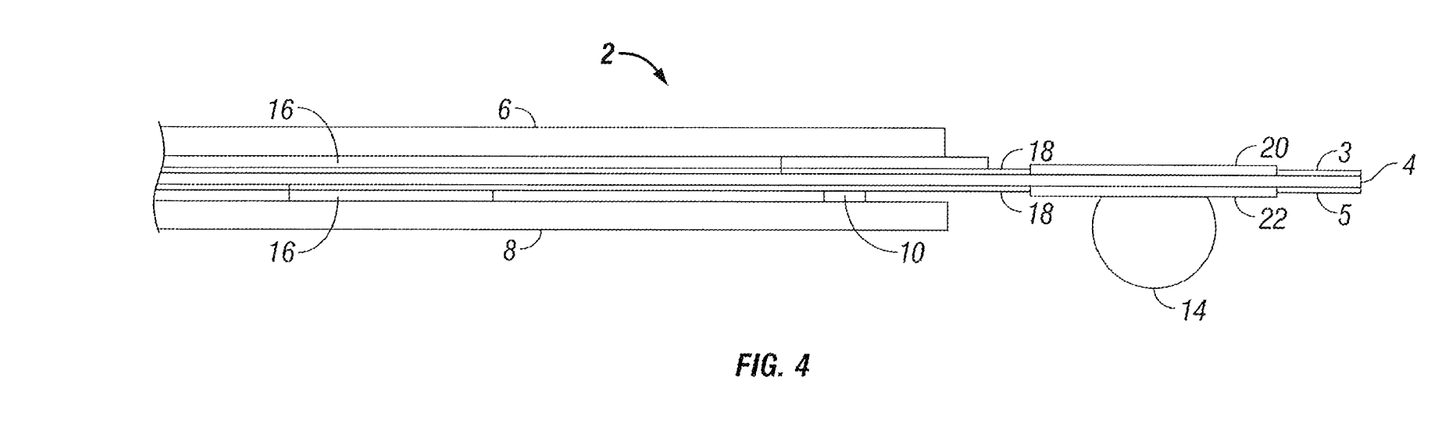
FIG. 4 is an enlarged depiction of a portion of the front elevation view of an embodiment identified in FIG. 3 by "A."

FIG. 4 is an enlarged depiction of a portion of the front elevation view of an embodiment identified in FIG. 3 by "A" and depicts dice 6 and 8 bonded to substrate 4 with an underfill material 16 disposed between substrate 4 and dice 6 and 8. Underfill material 16 may serve to conduct thermal energy imparted to first die 6 to heat substrate 4. Substrate 4 may carry conductive layers 18 (e.g., copper film) configured as traces, connection sites or the like along first surface 3 and second surface 5. Any number of additional coatings may be applied as needed, to substrate 4 or dice 6 and 8. For example, a top cover coat 20 and a bottom cover coat 22 may be applied to respective surfaces of substrate 4 adjacent to, or surrounding the solder balls 14. A suitable top cover coat is solder mask material that is generally screened or photo-imaged to form the required patterns on the substrate. Alternative additional coatings include adhesives, conductive traces, flux, sealants, encapsulants, or other known or later developed coatings.

Figure 5:
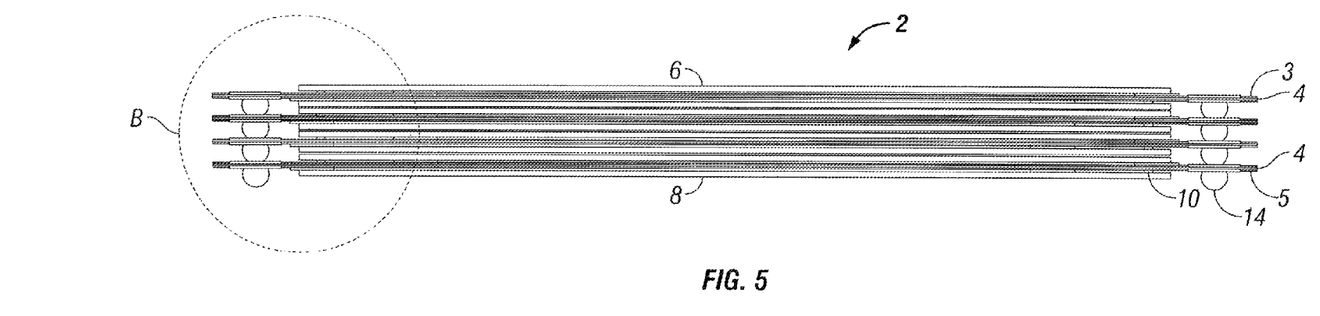
FIG. 5 is a front elevation depiction of an exemplary stacked dual-die package in accordance with an embodiment.

FIG. 5 is a front elevation depiction of an exemplary stacked configuration of IC packages 2 in accordance with another embodiment. Packages 2 are depicted with bumps 10 on alternating ends of surfaces 3 and 5 of substrate 4. It is understood, however, that bumps 10 and pads 12 may be suitably sized, positioned, or aligned depending on the application. As described above, positioning within the perimeters of dice 6 and 8 may be advantageous in certain applications, for example, providing improved signal integrity, density, stability, and the like.

Figure 6:
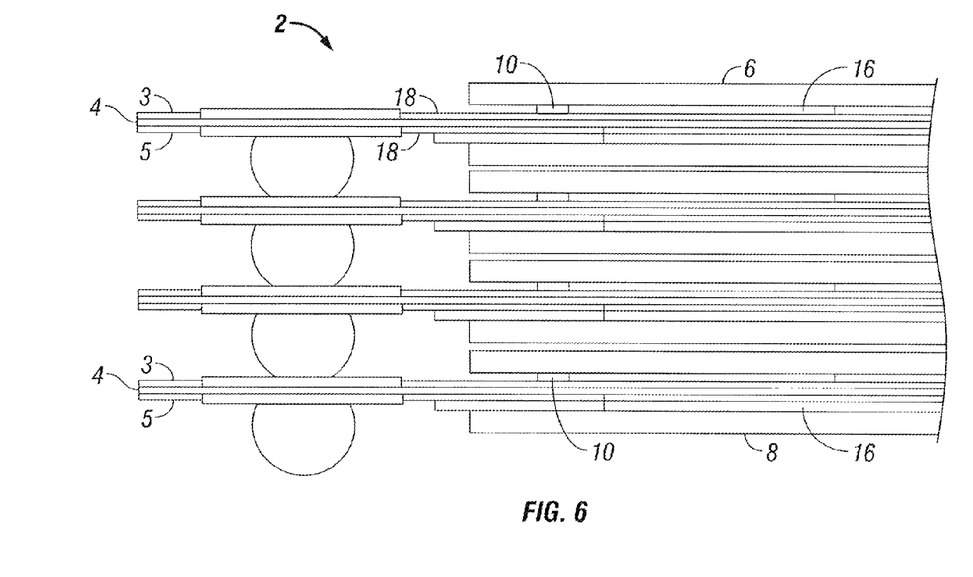
FIG. 6 is an enlarged depiction of a portion of the front elevation view of an embodiment identified in FIG. 5 by "B."

FIG. 6 is an enlarged depiction of a portion of the front elevation view of an embodiment identified in FIG. 5 by "B." Conductive layers 18, top coating 20 and bottom coating 22 are depicted on substrate 4 as described above. While bonding pads 12 may not visible in the assembled or elevation views, it is understood that bumps 10 are substantially co-located with corresponding pads 12.

Figure 7:
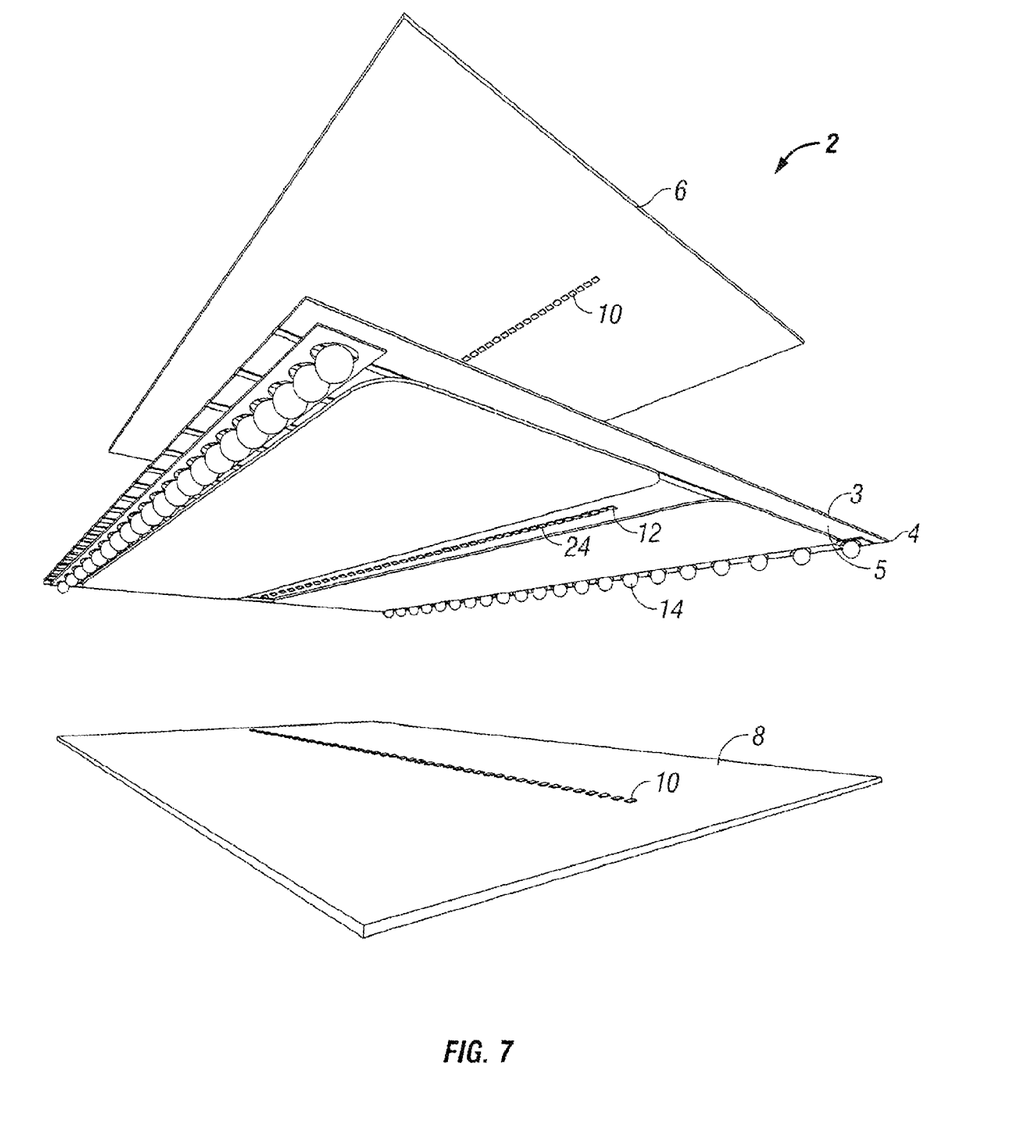
FIG. 7 is an exploded perspective depiction of exemplary dual-die package as may be employed in embodiments.

FIG. 7 is an exploded perspective depiction of an exemplary dual-die package 2 as may be employed in embodiments having bumps 10 and pads 12 centrally aligned on corresponding surfaces of substrate 4 and dice 6 and 8. Pads 12 may be disposed on a single side of substrate 4 around openings 24 extending through substrate 4. Bumps 10 on first die 6 bond to pads 12 on first surface 3 of substrate 4 while bumps 10 on second die 8 bond to pads 12 on first surface 3 through openings 24. In such alternative embodiments, it may be advantageous to use bumps 10 of greater height on second die 8 than used on first die 6 to allow for the thickness of substrate 4 while still providing sufficient material for bonding to pad 12. Alternatively, openings 24 may form conductive vias between opposing series of pads 12 on substrate surfaces 3 and 5. Pad-to-pad connections optimize signal integrity by shortening the connection between same-function bumps. Spacer elements may be used in the corners or along the edges of dice 6 and 8, or as otherwise configured, to align the respective die and substrate in a co-planar position during bonding, filling, and operation.

Figure 8:
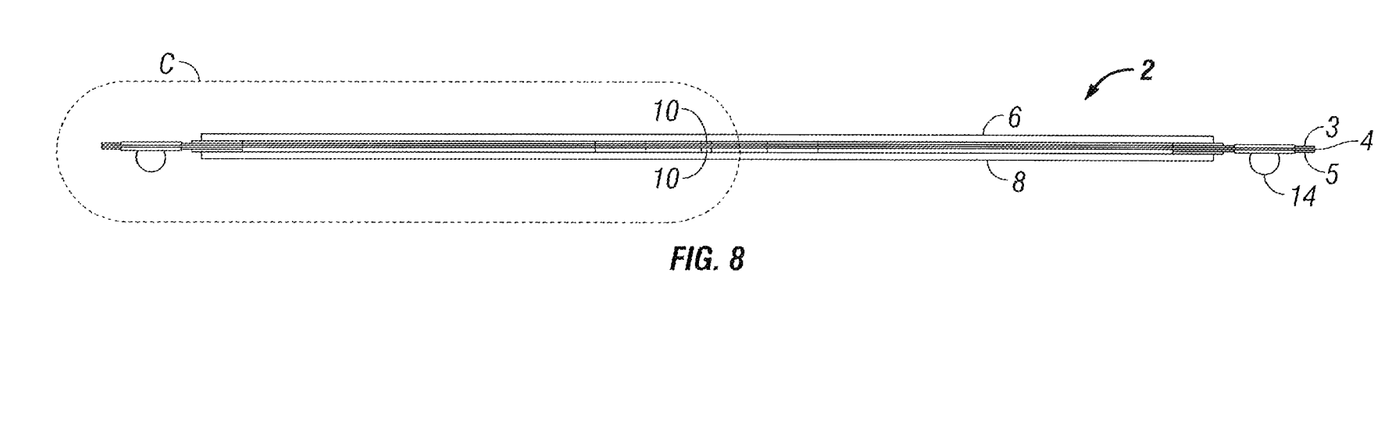
FIG. 8 is a front elevation depiction of an exemplary dual-die package as may be employed in embodiments.

FIG. 8 is a front elevation depiction of an exemplary dual-die package 2 wherein corresponding series of bumps 10 are aligned on opposite sides of substrate 4 to provide optimum signal integrity and density characteristics. In various alternative embodiments, bonding pads 12 need not align opposite each other on substrate 4 and may accommodate any suitable bonding pad pattern.

Figure 9:
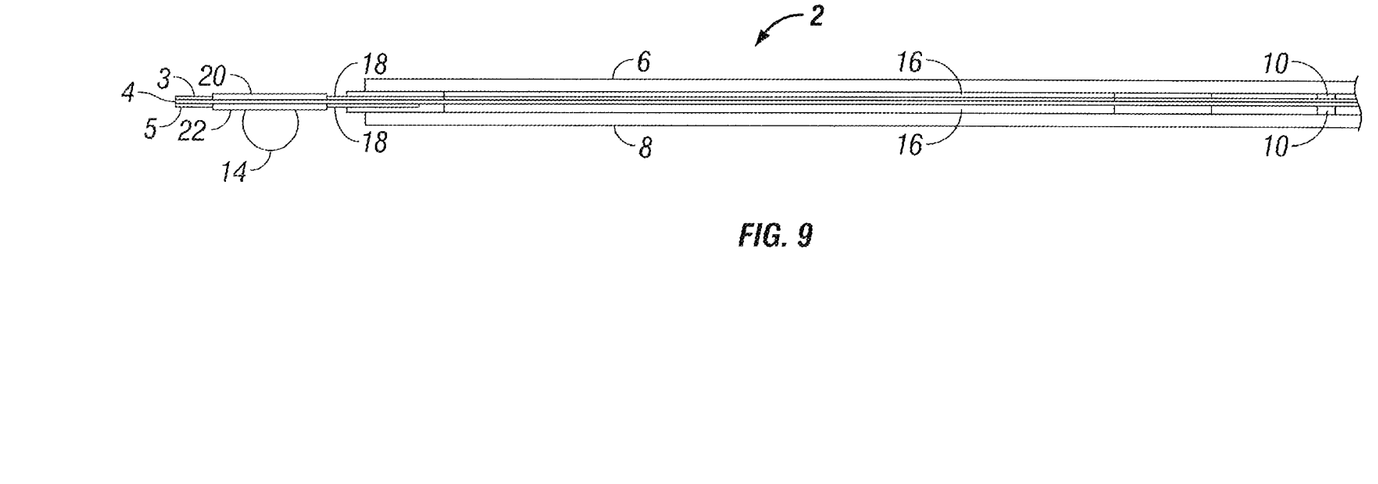
FIG. 9 is an enlarged depiction of a portion of the front elevation view of an embodiment identified in FIG. 7 by "C."

FIG. 9 is an enlarged depiction of a portion of the front elevation view of an embodiment identified in FIG. 7 by "C." Package 2 is depicted as including underfill material 16, conductive layers 18, top layer 20 and bottom layer 22, however, these elements or configurations may not be present in some embodiments.

According to an exemplary method of assembling various dual-die IC package embodiments depicted in FIGS. 1-9, first die 6 is mounted to first surface 3 of substrate 4. Then, preferably first die 6 is underfilled with underfill material 16, and second die 8 is mounted to second surface 5 of substrate 4 using thermocompression or thermosonic bonding. Advantages of various embodiments may be realized by other bonding methods.

For optimal bonding, both second die 8 and substrate 4 may be heated. During normal single die bonding, substrate 4 is heated directly, however, the presence of first die 6 in dual-die bonding prevents direct heating of the substrate during bonding of second die 8. Thus, according to one embodiment, heat is applied to the already mounted first die 6, which in turn transfers the heat to substrate 4. Thus, it may be beneficial to select underfill material 16 to provide good thermal conductivity between die 6 and substrate 4. Tight proximity of die 6 and substrate 4 may also facilitate improved heat transfer as well as produce a thin package. Thus, the bonding process may be optimized to require minimal direct heating of substrate 4 during bonding of second die 8.

Second die 8 is then bonded to substrate 4 using one of thermocompression bonding and thermosonic bonding. Thermocompression bonding may be optimized with short gold bumps 10 and tin pads 12 on substrate 4, since gold has excellent thermal conductivity and tin has a relatively low melting temperature. Alternately, gold-gold thermosonic bonding may be used since the added ultrasonic energy reduces the temperatures required for bonding.

If multiple die are to be mounted on each side of substrate 4, use of a compliant thermally conductive material on the bonding stage helps to compensate for potential slight height irregularities across bonded chips, while providing the necessary support and thermal conductivity. Such materials are available from 3M and others. An optional spacer element, alignment feature or bump-like feature on the substrate may be used to improve the stacking process by maintaining the parallelism and stability between dice 6 and 8 and substrate 4.

Finally, while the present invention has been described above with reference to various exemplary embodiments, many changes, substitutions, combinations and modifications may be made to the exemplary embodiments without departing from the scope of the present invention. For example, the various components may be implemented in alternative ways. These alternatives can be suitably selected depending upon the particular application or in consideration of any number of factors associated with the operation of the device. In addition, the techniques described herein may be extended or modified for use with other types of devices. While the present invention has been described herein as a system and method for use with stacked integrated circuit packages, the present invention may be readily used with any number of other similar devices now known or hereafter developed. These and other changes or modifications are intended to be included within the scope of the present invention. The described embodiments are only illustrative and not restrictive and the scope of the invention is, therefore, indicated by the following claims.

What is claimed is:

1. A dual-die integrated circuit package comprising:
a substrate having first and second opposing substrate surfaces;
a first die bonded to the first substrate surface;
a second die bonded to the second substrate surface at least partly using thermal energy conducted through the first die to the substrate;
further comprising a first set of conductive bumps on the first die and a second set of conductive bumps on the second die substantially aligned with corresponding bonding sites centrally positioned on the substrate; and
wherein the respective conductive bumps on the first die and the second die are connected to the same bonding sites on the substrate, with the conductive bumps of one of the first die and the second die extending through openings formed in the substrate.

2. The package of claim 1, wherein the corresponding bumps on the first die and second die are positioned within the perimeters of both the first die and the second die.

* * * * *